United States Patent
Tategami

(10) Patent No.: US 8,471,553 B2
(45) Date of Patent: Jun. 25, 2013

(54) PULSE SIGNAL GENERATING APPARATUS, ROTATING MACHINE, CONTROL APPARATUS, AND POWER WINDOW CONTROL APPARATUS

(75) Inventor: Toru Tategami, Chiba (JP)

(73) Assignee: Mabuchi Motor Co. Ltd., Chiba (JP)

( * ) Notice: Subject to any disclaimer, the term of this patent is extended or adjusted under 35 U.S.C. 154(b) by 270 days.

(21) Appl. No.: 12/809,046

(22) PCT Filed: Oct. 31, 2008

(86) PCT No.: PCT/JP2008/003131
§ 371 (c)(1),
(2), (4) Date: Jun. 17, 2010

(87) PCT Pub. No.: WO2009/078118
PCT Pub. Date: Jun. 25, 2009

(65) Prior Publication Data
US 2011/0192087 A1    Aug. 11, 2011

(30) Foreign Application Priority Data
Dec. 17, 2007 (JP) .................................. 2007-324389

(51) Int. Cl.
*G01B 7/30*    (2006.01)
(52) U.S. Cl.
USPC .................................................... 324/207.25
(58) Field of Classification Search
USPC ...................................... 324/173–174, 207.25
See application file for complete search history.

(56) References Cited

U.S. PATENT DOCUMENTS

| | | | |
|---|---|---|---|
| 6,717,400 B2 * | 4/2004 | Ito et al. | 324/207.13 |
| 7,098,654 B2 * | 8/2006 | Mehnert et al. | 324/207.25 |
| 7,268,539 B2 * | 9/2007 | Sato et al. | 324/207.25 |
| 2002/0190709 A1 * | 12/2002 | Frederick et al. | 324/207.2 |

FOREIGN PATENT DOCUMENTS

| | | |
|---|---|---|
| JP | 08-181575 | 7/1996 |
| JP | 11-107624 | 4/1999 |
| JP | 2001194182 A * | 7/2001 |
| JP | 2002-026698 | 1/2002 |
| JP | 2006-352608 | 12/2006 |

OTHER PUBLICATIONS

Goto et al, Partial Translation of JP 2001 194182 A. Jul. 10, 2001.*
International Search Report re PCT/JP2008/003131 (including translation thereof), dated Dec. 9, 2008.

(Continued)

*Primary Examiner* — Bot Ledynh
(74) *Attorney, Agent, or Firm* — Schwabe, Williamson & Wyatt

(57) ABSTRACT

A magnetic path is formed, in response to the rotation of a motor, by a magnetic detector (24 or 26) (more exactly, a magnetic wire (70)), a magnetic pole of the magnet (22), which is placed counter to each magnetic detector, and the rotating shaft (20). The magnetic wire (70) is formed of a magnetic material capable of causing a large Barkhausen jump. Whenever the magnetic pole opposite each magnetic element changes in response to the rotation of the motor, the direction of magnetic field constituting the magnetic path changes precipitously and a pulse signal in response to the change is outputted from the magnetic detector. Since the direction of magnetization of the magnetic wire (70) changes with a change in magnetic flux density received from a magnet (22), an induced electromotive force occurs due to a change in magnetic flux received by a detection coil. This makes enables the magnetic detector to output pulse signals without power supply.

9 Claims, 7 Drawing Sheets

OTHER PUBLICATIONS

International Preliminary Examination Report on Patentability re PCT/JP2008/003131 (including translation thereof), dated Jun. 22, 2010.

Office Action mailed Dec. 11, 2012 for Japanese Patent Application No. 2007-324389; 4 pages.

* cited by examiner

PULSE SIGNAL GENERATING APPARATUS, ROTATING MACHINE, CONTROL APPARATUS, AND POWER WINDOW CONTROL APPARATUS

TECHNICAL FIELD

The present invention relates to an apparatus for generating pulse signals in response to the rotation of a rotating body and an apparatus for performing control by detecting the pulse signals.

BACKGROUND TECHNOLOGY

A power window control apparatus mounted on a vehicle raises or lowers the door glass to a desired position by operating a glass raising/lowering mechanism by the drive of a motor. Since a raised or lowered position of the door glass can be calculated from the number of rotations of the motor, a control unit performs control by constantly detecting the rotational state of the motor (See Patent Document 1, for instance).

The rotational state of this motor is detected by a rotation detection sensor provided on a rotating shaft of the motor. The rotation detection sensor comprises, for example, a magnet whose north pole and south pole are oppositely disposed on a rotating shaft of the motor and hall elements that are disposed therearound. As the magnet rotates together with the rotating shaft of the motor, pulsing detection signals (hall voltages) proportional to the magnetic flux density are outputted from the hall elements. The rotational speed of the motor can be determined by calculating the rotation period of the motor from the pulse interval of the detection signals. In such a case, if two hall elements are disposed out of phase from each other relative to a single magnet for instance, then the rotational direction of the motor can also be detected by comparing the on and off states of the detection signals outputted from the two hall elements.

[Patent Document 1] (1) Japanese Patent Application Publication No. Hei11-107624.

DISCLOSURE OF THE INVENTION

Problems to be Solved by the Invention

It is to be noted that to have such a rotation detection sensor perform its function, there must always be power supply to the hall elements. However, it is a general practice with a view to achieving electric power saving that power supply to the hall elements is cut off whenever the engine of the vehicle is stopped. Thus, the necessity to detect any load externally applied to the door glass while the vehicle is parked cannot be readily met as a measure to prevent crimes like theft from the car. To meet such a necessity, the rotation detection sensor must be ready for operation even when power supply is off. Also, in realizing that, it is desirable that the apparatus be constructed at low cost.

A problem like this is found not only with the power window of a vehicle but also with equipment, such as a sliding roof or an automatic door or shutter, which controls drive by detecting the rotational state of the driving motor thereof by a rotation detection sensor. And realization of the detection of rotation without power supply at low cost may provide advantages for not only motors but also for other rotating bodies such as rotating machines of generators and so forth.

The present invention has been made in view of these problems, and a purpose thereof is to realize an apparatus for detecting rotation of a rotating body without power supply and at low cost.

Means for Solving the Problems

In order to resolve the foregoing problems, one embodiment according to the present invention provides a pulse signal generating apparatus for generating pulse signals in response to a rotation of a rotating body, and this apparatus comprises: a magnet fixed to a rotating shaft of the rotating body; and a magnetic detector which outputs the pulse signal when the magnet passes nearby with the rotation of the rotating body, the magnetic detector including: a magnetic element formed of a magnetic material; and a detection coil wound around the magnetic element. The magnetic element of the magnetic detector, one of magnetic poles of the magnet, which is placed opposite to the magnetic element, and the rotating shaft are positioned in such relation to each other as to form a magnetic path.

The "magnetic element" mentioned above may be a magnetic core such as an iron core and is preferably a magnetic element formed of a magnetic material capable of causing a large Barkhausen jump. The magnetic element may be formed of an elongated magnetic material (e.g., a rod-like one) or may be formed of a magnetic wire or the like. The rotating shaft is preferably one formed of a ferromagnetic material.

According to this embodiment, the magnetic path is formed, in response to the rotation of the rating body, by the magnetic element, the magnetic pole of the magnet which is placed opposite thereto, and the rotating shaft. Accordingly, whenever the magnetic pole opposite the magnetic element changes in response to the rotation of the rotating body, the direction of magnetic field constituting the magnetic path changes and a pulse signal is outputted from the magnetic detector in response to the change. That is, since the direction of magnetization of the magnetic element changes with a change in magnetic flux density received from the magnet, an induced electromotive force occurs due to a change in magnetic flux received by a detection coil. This enables the magnetic detector to output pulse signals without power supply. Also, since the rotating shaft of the rotating body constitutes a part of the magnetic path, there is no need to provide a biasing magnet additionally or a pair of magnets to create an alternating magnetic field. Thus, the structure of an apparatus can be made simple and realized at low cost.

Effect of the Invention

The present invention provides an apparatus for detecting the rotation of a rotating body without power supply and at low cost.

DESCRIPTION OF THE REFERENCE NUMERALS

Figure 1:
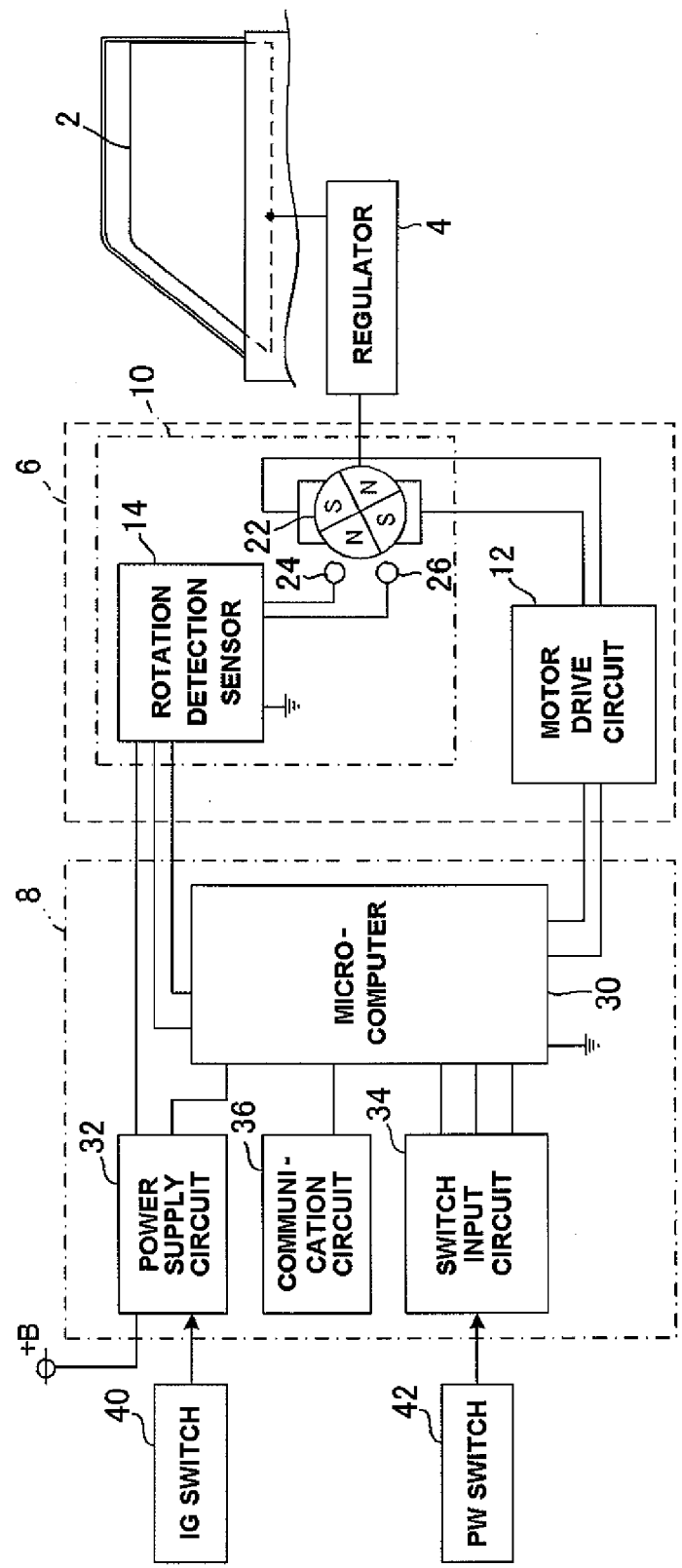
FIG. 1 shows a schematic constitution of a power window control apparatus according to an exemplary embodiment.

2 Door glass, 4 Regulator, 6 Motor actuator, 8 Control unit, 10 Motor, 12 Motor drive circuit, 14 Rotation detection sensor, 20 Rotating shaft, 22 Magnet, 24 Magnetic detector, 26 Magnetic detector, 30 Microcomputer, 32 Power supply circuit, 34 Switch input circuit, 36 Communication circuit, 42 PW switch, 50 Housing, 52 Bracket, 54 Cylindrical gear, 56 Magnetic shield plate, 60 Holder, 62 Circuit board, 64 Body, 66 Support, 68 Tapered surface, 70 Magnetic wire, 72 Detection coil, 74 Terminal, 76 Terminal, 78 Case.

BEST MODE FOR CARRYING OUT THE INVENTION

One embodiment according to the present invention relates to a pulse signal generating apparatus that generates pulse signals in response to a rotation of a rotating body. This pulse signal generating apparatus comprises: a magnet fixed to a rotating shaft of the rotating body; and a magnetic detector which outputs the pulse signal when the magnet passes nearby with the rotation of the rotating body wherein the magnetic detector includes a magnetic element and a detection coil wound around the magnetic element. The magnetic element of the magnetic detector, one of magnetic poles of the magnet, which is placed opposite to the magnetic element, and the rotating shaft are positioned in such relation to each other as to form a magnetic path.

A plurality of the magnetic detectors may be disposed at predetermined intervals circumferentially around the rotating shaft. By implementing this structure, the rotational direction of the rotating body can also be detected by comparing the states of a plurality of pulse signals outputted from the respective magnetic detectors.

The magnetic element is preferably at a predetermined distance from the rotating shaft and out of alignment with the magnet in a longitudinal direction of the rotating shaft. The central position of the magnetic element in a longitudinal direction is displaced from the opposed position of the magnet, so that the magnetic path formed by the magnetic elements, the magnetic poles and the rotating shaft is determined in one direction and is therefore formed stably.

In such a case, if the magnetic element is disposed such that one end thereof is closer to the magnet than the other end thereof, the magnetic flux from the magnet will be efficiently driven to the magnetic element. This facilitates the formation of the magnetic path formed by the magnetic element and the rotating shaft.

Further, if the magnetic element is disposed such that the other end thereof is closer to the rotating shaft than the one end thereof, a magnetic gap between the magnetic element and the rotating shaft will be reduced and therefore a stable magnetic path can be formed.

The magnetic element is preferably one formed of a magnetic material capable of causing a large Barkhausen jump. In such a case, the magnetic element may be constituted as a magnetic wire. The "magnetic element capable of causing a large Barkhausen jump" mentioned here is an element that generates a sudden reversal of magnetization state when the magnetic flux density received from the magnet exceeds a predetermined value and can be operated without power supply. Accordingly, such a magnetic element can be effectively incorporated into an apparatus requiring low power consumption.

Note that the operating principle of "a magnetic element capable of causing a large Barkhausen jump" is publicly known as is described, for instance, in Japanese Patent Publication No. 3673413. Herein, a magnetic wire formed by applying a twisting stress to a ferromagnetic wire which is obtained by wiredrawing a ferromagnetic material can be used as such a magnetic element. This magnetic wire displays different magnetic characteristics between the peripheral part and the central part thereof as a result of increasingly greater twist given in the peripheral part than in the central part, so that the central part changes its direction of magnetization in the presence of a larger magnetic field than the peripheral part. In other words, there is a state in which, depending on the size of the external magnetic field, the magnetization direction of the central part remains unchanged even when that of the peripheral part changes, and when the strength of the external magnetic field exceeds a certain critical strength, the magnetic wire as a whole undergoes a sudden reversal of the direction of magnetization. The phenomenon of such a sudden reversal of magnetization state is called a "large Barkhausen jump", and by the use of this phenomenon, a sharply pulsing output signal (voltage signal) can be obtained. Therefore, even when the rotating speed of a rotating body is low, the pulse can be captured reliably, which assures the accuracy of rotation detection. It is to be noted that the "magnetic element capable of causing a large Barkhausen jump" is not limited to a wire-shaped magnetic element as described above but may be any of a variety of magnetic elements in thin-film, thick-film or other forms which exhibits a similar behavior.

A pulse signal generating apparatus as described above can be incorporated as a pulse signal generator into a rotating machine, such as a motor or generator, which generates pulse signals in response to the rotation of the rotating shaft thereof. In such a case, the arrangement may be such that a circuit board mounting the magnetic detector and a circuit for processing the pulse signals is mounted on the body of the rotating machine. Or the arrangement may be such that the circuit board is incorporated into the body of an actuator including the rotating machine. Where a control unit of the rotating machine is provided separately, the circuit board may be installed inside the control unit.

Also, a function of this pulse signal generating apparatus may be incorporated into a control apparatus that acquires the rotational characteristics of the motor and controls an object to be controlled based on the acquired rotational characteristics. The "rotational characteristics" mentioned here may include the number of revolutions, the rotational speed, the rotation period, or the rotational frequency of the motor. The control apparatus may comprise: a circuit which processes the pulse signal outputted from the magnetic detector and outputs the processed signal; an arithmetic unit which calculates the rotational characteristics of the motor based on an output signal from the circuit; and a control unit which controls the drive of the motor based on the calculated rotational characteristics. For example, the above-described apparatus may be structured as a control apparatus used for equipment, such as a power window, a sliding roof or an automatic door or shutter, which is driven by a motor and controls drive by detecting the rotational speed of the motor by a rotation detection sensor. Such the control apparatus may calculate the rotational speed of the motor based on an output signal from the circuit and control the rotation of the motor by shifting to a preset control mode according to the rotational speed thereof. If structured as a power window control apparatus, the control unit may execute a preset control mode when a signal is outputted even during a period in which no control is performed. This control mode may be a security mode where a predetermined closing operation is activated if the door glass is forcibly moved to an open direction by an external load, for example.

The invention is now described in detail using concrete exemplary embodiments. The following exemplary embodiments are reductions to practice where a function of a pulse signal generating apparatus according to the present invention is incorporated into a power window control apparatus.

[Exemplary Embodiment]

FIG. 1 shows a schematic constitution of a power window control apparatus according to an exemplary embodiment. For convenience of explanation, a power window control apparatus as shown in FIG. 1 is one installed in a position operable from the driver's seat.

The power window control apparatus according to the present exemplary embodiment is used to control the drive of a regulator 4 for raising or lowering a door glass of a motor vehicle. This power window control apparatus comprises a motor actuator 6 which drives the regulator 4 and a control unit 8 which drives the motor actuator 6.

The motor actuator 6 includes a motor 10 for driving the regulator 4, a motor drive circuit 12 for driving the motor 10, and a rotation detection sensor 14 for detecting the rotation status of the motor 10. The motor 10, whose rotating shaft is coupled to a not-shown arm of the regulator 4 via a speed-reduction gear, rotates in the normal direction to extend an arm, thereby moving the door glass 2 in the closing direction, and rotates in the reverse direction to contract the arm, thereby moving the door glass 2 in the opening direction.

The motor drive circuit 12 includes a plurality of relay circuits performing on/off action according to command signals from the control unit 8. Each relay circuit has a transistor, and each relay is switched on or off by turning on or off the current to the transistor. In this manner, the voltage is applied to the motor 10 for normal rotation or reverse rotation.

The rotation detection sensor 14 outputs a pulse signal according to the rotation of the motor 10 to the control unit 8. In this exemplary embodiment, the rotation detection sensor 14 is mounted integrally on the motor 10. The rotation detection sensor 14 is structured by including two magnetic detectors 24 and 26. The two magnetic detectors 24 and 26, which are disposed counter to the magnet 22 fixed to the rotating shaft of the motor 10, are capable of causing a large Barkhausen jump. A detailed description of this rotation detection sensor 14 is given later The control unit 8 includes a microcomputer 30 as the central component, a power supply circuit 32, a switch input circuit 34, and a communication circuit 36. The power supply circuit 32 supplies the power-supply voltage of a not-shown battery to such units as the microcomputer 30 and so forth. Also, input signals from an ignition switch (hereinafter referred to as "IG switch") 40 are inputted to the microcomputer 30 via the power supply circuit 32. The microcomputer 30 includes a CPU for performing various arithmetic processings, a ROM for storing various control programs, a RAM used for data storage and as a work area for executing programs, an I/O interface, a timer for timekeeping, and the like.

The switch input circuit 34 inputs input signals according to the operation of a power window switch (hereinafter referred to as "PW switch") 42 by a driver to the microcomputer 30. The switch input circuit 34 includes a manual switch and an auto switch. The manual switch includes an opening switch and a closing switch. The opening switch, which is turned on when the driver pushes the PW switch 42 one step down, outputs a signal for moving the door glass 2 in the opening direction only during a push-down operation. The closing switch, which is turned on when the driver pulls up the PW switch 42 one step up, outputs a signal for moving the door glass 2 in the closing direction only during a pull-up operation. On the other hand, the auto switch turns on when the PW switch 42 is operated two steps and outputs a signal to keep moving the door glass 2 in the opening or closing direction even after the driver has stopped operating the switch.

The communication circuit 36 is a circuit for two-way communication with a not-shown central control unit installed in a vehicle and is coupled to the central control unit via a not-shown communication line. The central control unit, which is connected to the control unit 8 provided in the driver's seat, a control unit provided in the passenger seat, and a control unit provided in each of the right-hand and left-hand backseats, manages these control units in a unified manner. Also provided in the driver's seat are PW switches for driving and controlling the door glasses of the passenger seat and backseats. As the driver operates these switches, the respective operation command signals are transmitted to those control units via the central control unit.

The microcomputer 30 carries out predetermined arithmetic processings according to the input signals from the sensors and switches and the communication circuit 36, and outputs control signals to the motor drive circuit 12. The microcomputer 30 also communicates with the central control unit whenever necessary.

Figure 2:
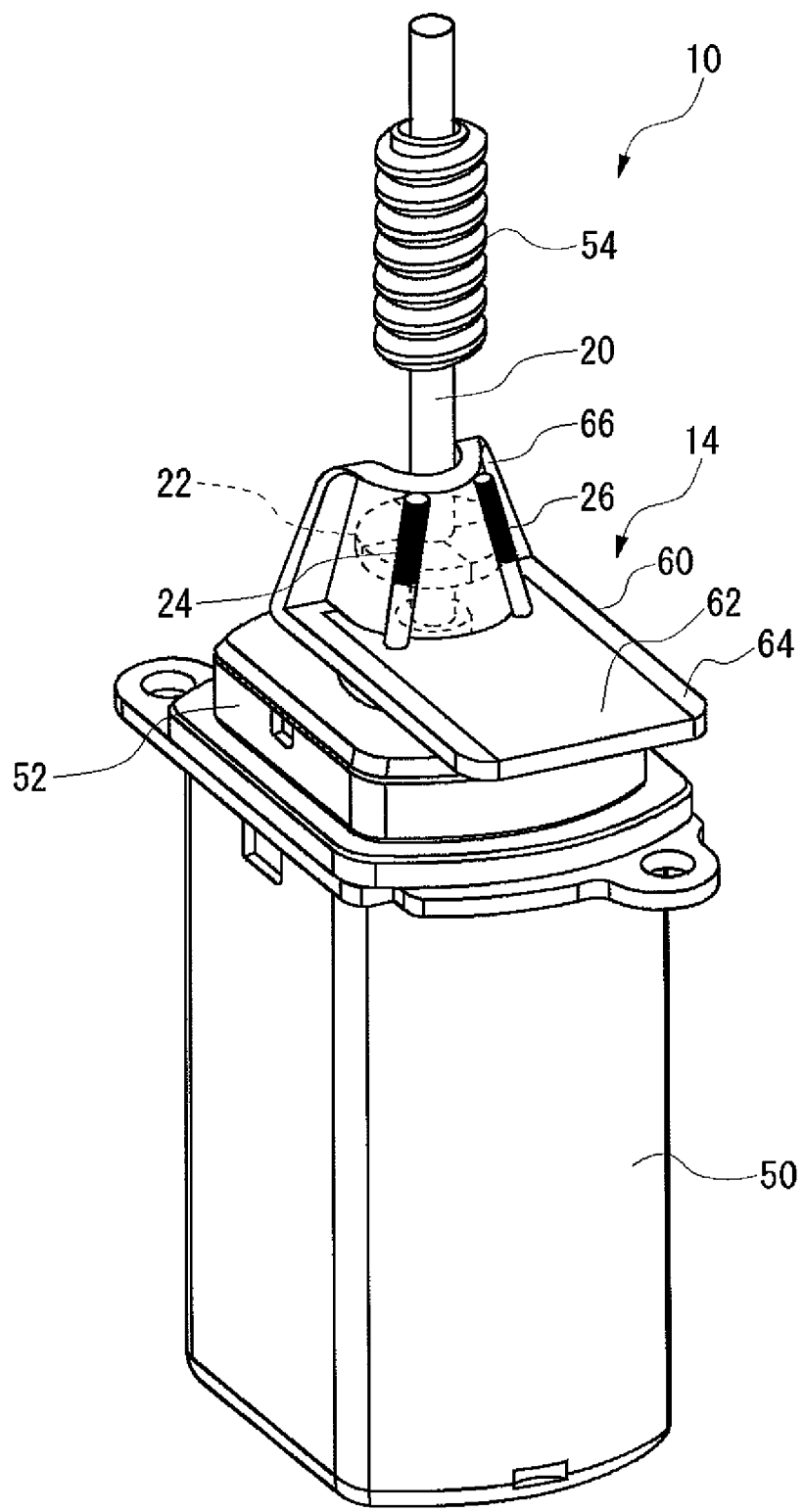
FIG. 2 is a perspective view showing a specific structure of a motor.

FIG. 2 is a perspective view showing a specific structure of a motor.

A motor 10 is structured as a small direct current motor. A not-shown stator and rotor are provided within a cylindrical housing 50, and a part of a rotating shaft 20 is exposed from a bracket 52 which seals an end of the housing 50. Disposed within the motor 10 are the rotating shaft 20, an armature and a commutator, which together make up the rotor, a bearing which supports the rotating shaft 20 rotatably, a brush in sliding contact with the commutator, and so forth. A detailed description of the internal structure, which is generally known, is omitted here.

The rotating shaft 20 is an output shaft formed of a ferro-magnetic material, and a cylindrical gear 54 is press-fitted on an end portion thereof. The motive energy of the motor 10 is conveyed to a regulator 4 through the medium of the rotating shaft 20, the cylindrical gear 54 and a reduction gear. A disk-shaped magnet 22 is fixed on the rotating shaft 20 between the bracket 52 and the cylindrical gear 54, and a rotation detection sensor 14 is disposed opposite to the magnet 22.

Figure 3:
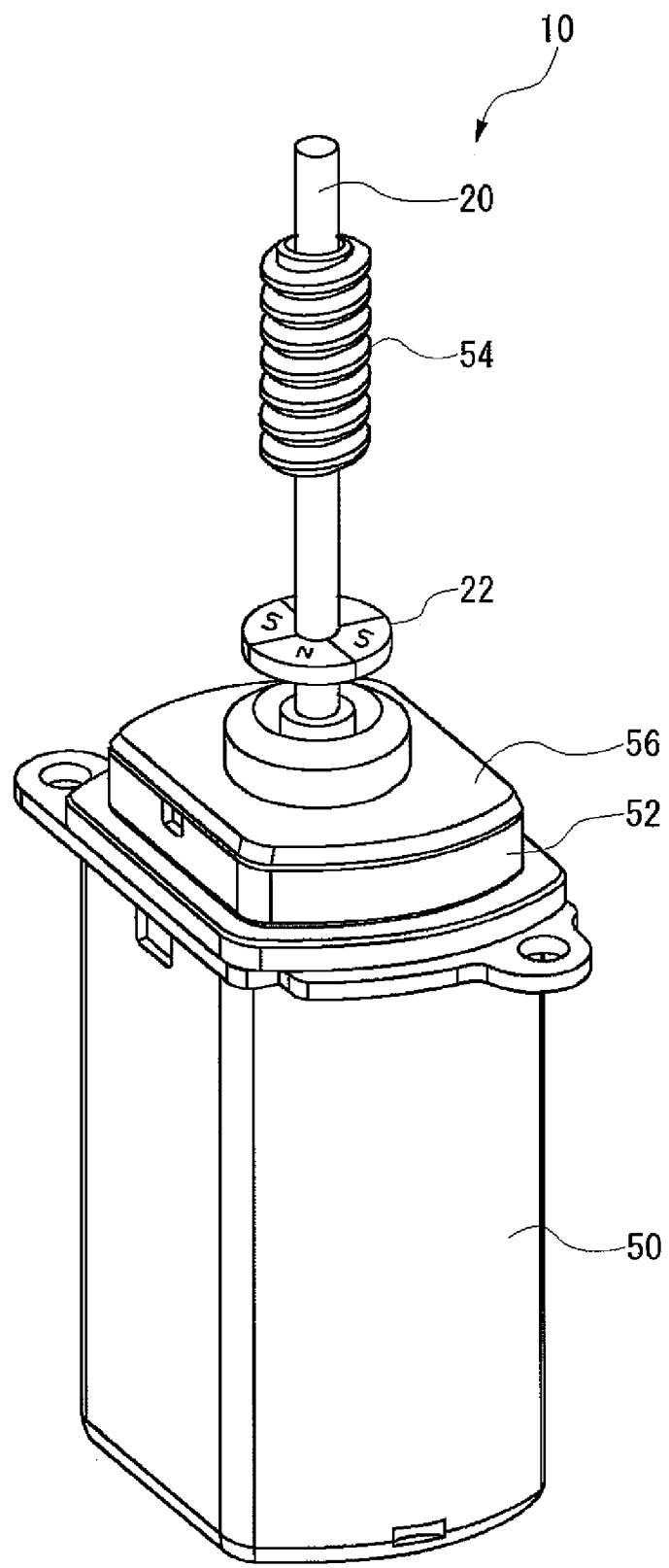
FIG. 3 is a perspective view showing a body of a motor.
Figure 4:
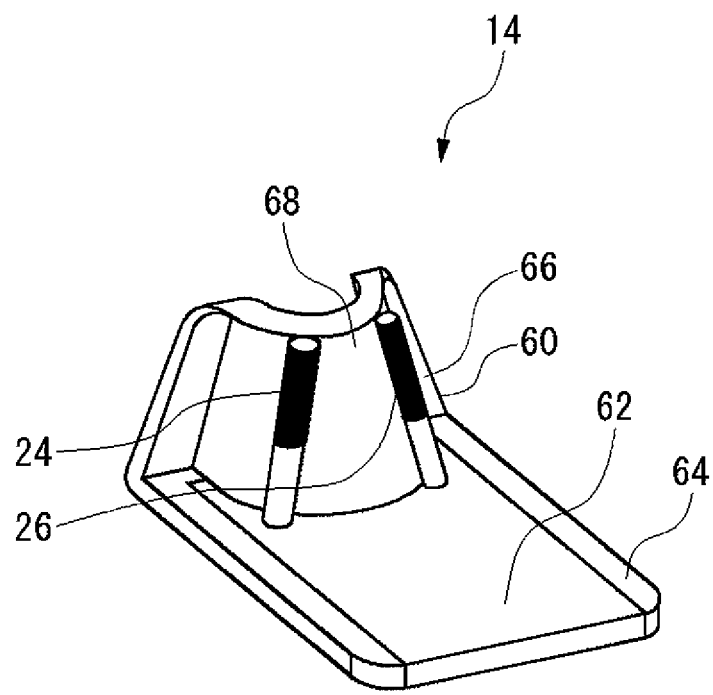
FIG. 4 is a perspective view showing a structure of a rotation detection sensor.
Figure 5:
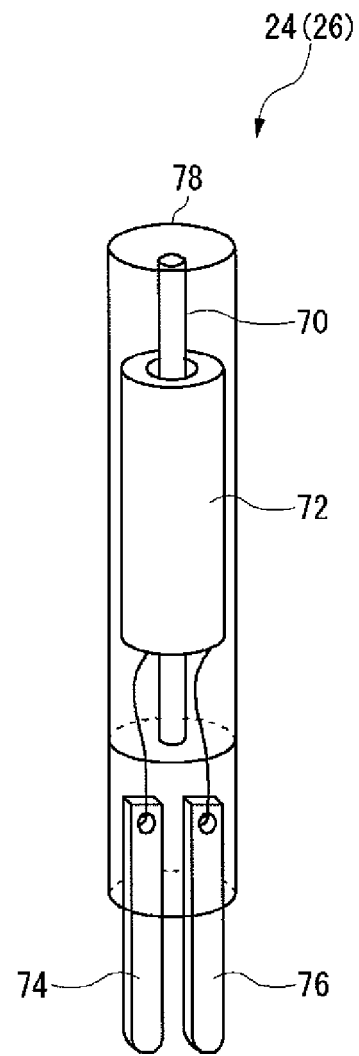
FIG. 5 is a perspective view showing a structure of a magnetic detector.

FIG. 3 is a perspective view showing a body of the motor. FIG. 4 is a perspective view showing a structure of the rotation detection sensor. FIG. 5 is a perspective view showing a structure of a magnetic detector.

As shown in FIG. 3, a magnetic shield plate 56, which shields the leakage of magnetic flux from inside, is fitted on an end face of the bracket 52 of the motor 10. The magnet 22 is a tetrapolar magnet with the north pole and the south pole disposed next to each other at intervals of about 90 degrees such that the boundary of the magnetic poles appears every 90 degrees or so in rotation phase.

As shown in FIG. 4, the rotation detection sensor 14 is so structured as to include a holder 60 placed opposite to the magnet 22, a circuit board 62 partially buried under the holder 60, and magnetic detectors 24 and 26 which are fixed to the holder 60 and mounted on the circuit board 62. The holder 60 includes a plate-like body 64 of nonmagnetic material and a support 66 standing upright at an end of the body 64. The circuit board 62, which is embedded in the body 64, packages a plurality of circuit elements that constitute a pulse conversion circuit to be described later. The support 66 is a boss capable of semicircularly surrounding the rotating shaft 20 and the magnet 22. The boss has a tapered surface 68 such that the tapered surface 68 is closer to the rotating shaft 20 as it is nearer the top end thereof, and the magnetic detectors 24 and 26 are fixed along the tapered surface 68. As illustrated in FIG. 4, therefore, the magnetic detector 24 and the magnetic detector 26 are so disposed that they are closer to each other at one end thereof than at the other end thereof. As shown in FIG. 2, the body 64 is disposed substantially perpendicular to the rotating shaft 20 and has the support 66 formed connectedly to the end thereof on the rotating shaft 20 side. The body 64 is fixed to the housing 50 of the motor 10 by a not-shown fixing member. The support 66 is so formed that it surrounds closely the magnet 22 on the bottom of the body 64 side and surrounds closely the rotating shaft 20 on the top side thereof.

As shown in FIG. 5, the magnetic detector 24 comprises a detection coil 72 wound around a part of an elongated magnetic wire 70. The magnetic wire 70 is formed of a magnetic material capable of causing a large Barkhausen jump. Terminals 74 and 76 are connected to their respective ends of the detection coil 72. These magnetic wire 70, detection coil 72, and terminals 74 and 76 are provided in a case 78 in the form of a bottomed cylinder of nonmagnetic material. Those parts are fixed stably with a resin material filled in the case 78. The terminals 74 and 76 are exposed from the opening of the case 78, and each of the terminals is soldered to the wiring on the circuit board 62. Note that a description of the magnetic detector 26, which is of the same structure as that of the magnetic detector 24, is omitted here.

Figure 6:
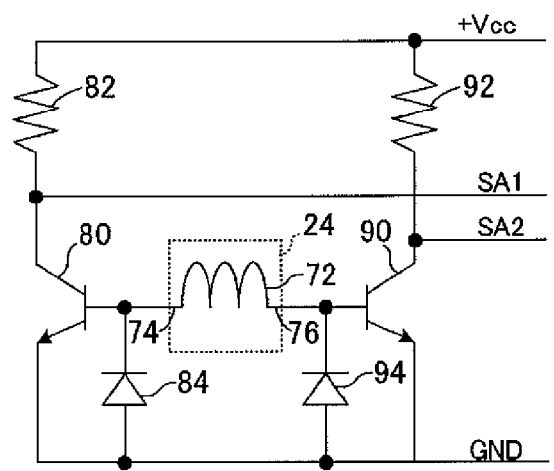
FIG. 6 is a diagram showing a pulse conversion circuit which is structured on a circuit board.

FIG. 6 is a diagram showing a pulse conversion circuit which is structured on the circuit board. For the convenience of explanation, a circuit structure about the magnetic detector 24 only is presented in the diagram.

As shown in FIG. 6, the terminal 74, one of the terminals of the detection coil 72 of the magnetic detector 24, is connected to the base of a transistor 80 and further connected to the power supply circuit 32 through a resistor 82 which is connected to the collector of the transistor 80. The emitter of the transistor 80 is connected to a ground line. A diode 84 is connected between the base of the transistor 80 and the ground line. The cathode of the diode 84 is connected to the connection point between the detection coil 72 and the transistor 80, and the anode thereof to the ground line. On the other hand, the terminal 76, the other of the terminals of the detection coil 72, is connected to the base of a transistor 90 and further connected to a power supply circuit 32 through a resistor 92 which is connected to the collector of the transistor 90. The emitter of the transistor 90 is connected to the ground line. A diode 94 is connected between the base of the transistor 90 and the ground line. The cathode of the diode 94 is connected to the connection point between the detection coil 72 and the transistor 90, and the anode thereof to the ground line.

A closed circuit is thus formed by the detection coil 72, the transistor 80 and the diode 94, and when there is a positive voltage on the terminal 74 side of the detection coil 72, the transistor 80 is turned on. On the other hand, a closed circuit is formed by the detection coil 72, the transistor 90 and the diode 84, and when there is a positive voltage on the terminal 76 side of the detection coil 72, the transistor 90 is turned on. The arrangement is such that an output signal SA1 (output voltage) is taken out of the connection point between the transistor 80 and the resister 82 and inputted to the microcomputer 30. Also, an output signal SA2 (output voltage) is taken out of the connection point between the transistor 90 and the resister 92 and inputted to the microcomputer 30.

Through the arrangement as described above, when the north pole of the magnet 22 passes by the magnetic detector 24 with a run of the motor 10, the transistor 80 is turned on, thereby outputting an output signal SA1 (output voltage) as a rectangular pulse signal of "on" switching to "off". Also, when the south pole of the magnet 22 passes by the magnetic detector 24, the transistor 90 is turned on, thereby outputting an output signal SA2 (output voltage) as a rectangular pulse signal of "on" switching to "off". As aforementioned, the magnetic detector 24 includes as a magnetic element a magnetic wire 70 which is capable of causing a large Barkhausen jump, so that the output signal due to the induced electromotive force is inputted to each transistor as a sharp output signal. Accordingly, the pulse signals SA1 and SA2 are also inputted to the microcomputer 30 as sharp pulse signals.

Note that the magnetic detector 26 also has a similar circuit configuration. Thus, the rotation detection sensor 14 outputs a similar pulse signal SB1 when the north pole of the magnet 22 passes by the magnetic detector 26 and a similar pulse signal SB2 when the south pole thereof passes by the magnetic detector 26. A detail of the operation will be discussed later.

Figure 7A:
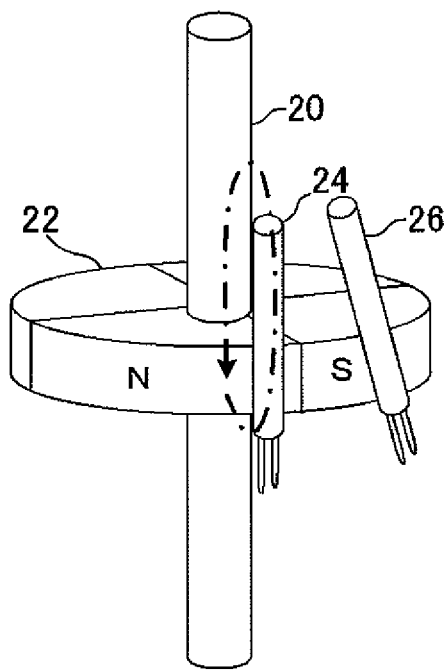
FIGS. 7A and 7B are schematic illustrations showing a structure of a rotation detector of a motor.
Figure 7B:
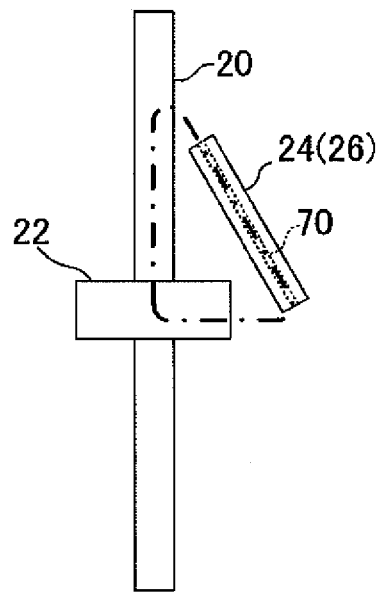

FIGS. 7A and 7B are schematic illustration showing a structure of a rotation detector of the motor. FIG. 7A is a perspective view, and FIG. 7B a side view thereof.

As shown in FIG. 7A, a tetrapolar magnet 22 with the north pole and the south pole disposed alternately around the rotating shaft 20 of the motor 10 is fixed on the rotating shaft 20. Magnetic detectors 24 and 26, on the other hand, are disposed at an interval of about 45 degrees circumferentially around the rotating shaft 20. Each of the magnetic detectors, which is disposed in a non-contact manner from the rotating shaft 20 and the magnet 22, has the terminal-side end thereof placed close to the magnet and the other end thereof close to the rotating shaft 20. Thus, as shown in FIG. 7B, a magnetic path (see the dashed-dotted line in FIG. 7B) is formed in a loop of the magnetic detector 24 or 26 (more exactly the magnetic wire 70 thereof), the magnetic pole of the magnet 22, which is placed opposite thereto, and the rotating shaft 20 as the motor 10 runs. Accordingly, whenever the magnetic pole opposite each of the magnetic detectors changes with the run of the motor 10, the direction of magnetic field constituting the magnetic path changes, and a pulse signal (pulse voltage) is outputted from each of the magnetic detectors in response to the change. In the present exemplary embodiment, each of the magnetic detectors is tilted in relation to the rotating shaft 20 in order to minimize the magnetic gap in the magnetic path. In a modification thereof, however, the magnetic detectors may be disposed parallel to the rotating shaft 20.

Figure 8:
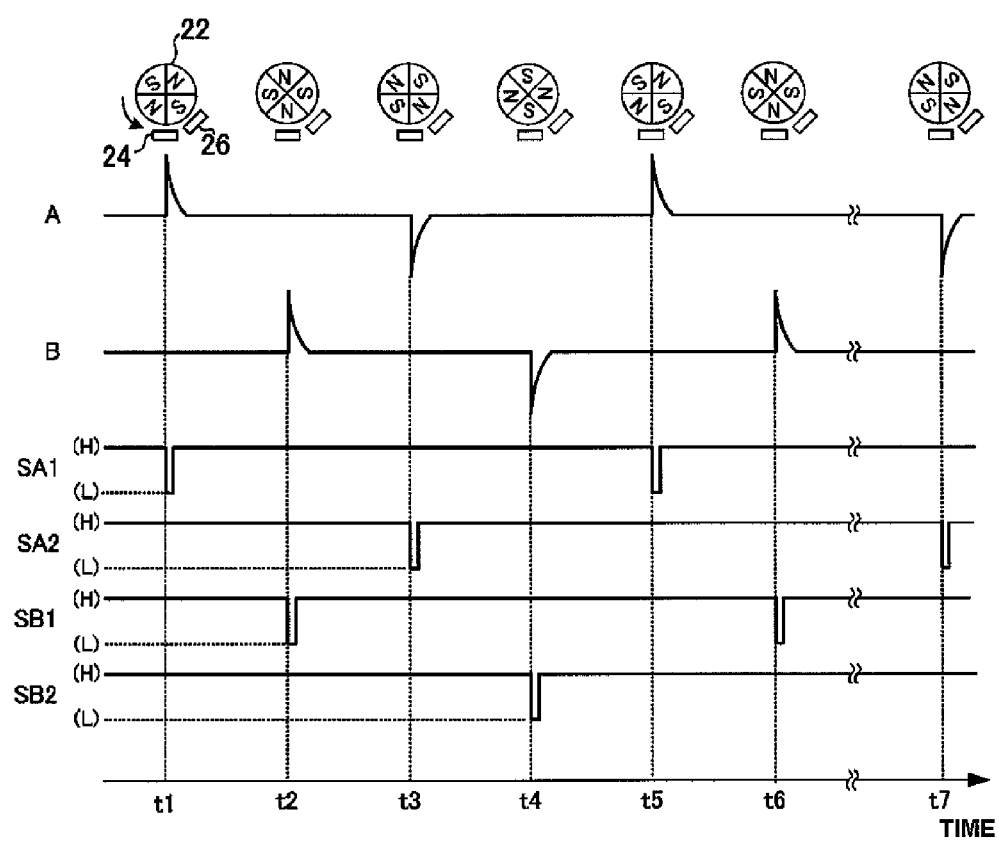
FIG. 8 is a diagram for explaining a method of calculating the rotation period of a motor.

A description will now be given of a method for detecting the rotational speed of the motor 10 according to the present exemplary embodiment. FIG. 8 is a diagram for explaining a method of calculating the rotation period of the motor. Shown from top to bottom in the diagram are signal A outputted from the magnetic detector 24, signal B outputted from the magnetic detector 26, pulse signals SA1 and SA2 based on the signal A which are outputted through the rotation detection sensor 14, and pulse signals SB1 and SB2 based on the signal B which are outputted through the rotation detection sensor 14. The horizontal axis of the diagram represents the lapse of time.

As shown in FIG. 8, for every 90 degrees of rotation of the magnet 22 with the run of the motor 10, the signal A is outputted from the magnetic detector 24. In other words, when the state of the magnetic detector 24 facing the south pole of the magnet 22 switches to the state thereof facing the north pole, the pulse signal SA1 switches instantaneously from the H level to the L level. On the other hand, when the state of the magnetic detector 24 facing the north pole of the magnet 22 switches to the state thereof facing the south pole, the pulse signal SA2 switches instantaneously from the H level to the L level. Also, when the state of the magnetic detector 26 facing the south pole of the magnet 22 switches to the state thereof facing the north pole, the pulse signal SB1 switches instantaneously from the H level to the L level. On the other hand, when the state of the magnetic detector 26 facing the north pole of the magnet 22 switches to the state thereof facing the south pole, the pulse signal SB2 switches instantaneously from the H level to the L level. In the present exemplary embodiment, the magnetic detector 24 and the magnetic detector 26 are disposed at an interval of about 45 degrees in relation to the magnet 22 as the center, so that the pulse signal is outputted from each of the magnetic detectors with a phase difference of about 45 degrees. In a modification thereof, however, the magnetic detector 24 and the magnetic detector 26 may be disposed at an interval different from the above angle.

In the present exemplary embodiment, as shown in FIG. 8, whenever the rotating shaft 20 rotates 45 degrees from time t1 to time t7, one of the pulse signals is outputted. The microcomputer 30 acquires pulse signals outputted sequentially from the rotation detection sensor 14 and calculates the time per rotation, namely, the rotation period of the motor 10, based on the time elapsed between the pulses and the phase difference. Then the rotational speed is calculated from this rotation period and used in the power window control. Even if there should be a stopped period of the motor 10 between t6 and t7 as shown, the microcomputer 30 will be able to detect the output of a pulse signal at t7, thereby detecting the restart of run of the motor 10, namely, the drive of the door glass 2. Note that the microcomputer 30 is provided with a latch circuit for latching pulse signals, which are sharp with short OFF periods, but a detailed description thereof is omitted here.

During normal control, the microcomputer 30 calculates the number of rotations of the motor 10, and further the position of the door glass 2, based on pulse signals detected sequentially, and carries out power window control in a predetermined manner. On the other hand, in cases where there is an attempt at forcibly opening the door glass for theft or such other purposes while the engine is stopped, for instance, during the parking of the vehicle, pulse signals are outputted from the magnetic detectors. Then the microcomputer 30, even in a sleep state, wakes up to the input of the pulse signals and carries out a predetermined security control mode of operation, such as driving the door glass 2 in a closing direction and keeping the opening at a size that does not allow the entry of an arm of a person.

As described above, in the present exemplary embodiment, a magnetic path is formed in a loop of the magnetic detector 24 or 26 (more exactly the magnetic wire 70 thereof), the magnetic pole of the magnet 22, which is placed opposite thereto, and the rotating shaft 20 as the motor 10 runs. The magnetic wire 70 is a magnetic material capable of causing a large Barkhausen jump, and therefore whenever the magnetic pole opposite each of the magnetic detectors changes with the run of the motor 10, the direction of magnetic field constituting the magnetic path changes sharply, and a pulse signal is outputted from each of the magnetic detectors in response to the change. Since the direction of magnetization of the magnetic wire 70 changes with a change in magnetic flux density received from the magnet 22, an induced electromotive force occurs due to a change in magnetic flux received by the detection coil 72, enabling the magnetic detectors to output pulse signals without power supply. Also, since the rotating shaft 20 constitutes a part of the magnetic path, there is no need to provide a biasing magnet in addition to the magnet 22 or a pair of magnets to create an alternating magnetic field. Thus, the present exemplary embodiment may be implemented with a simple structure at low cost. Also, the sharp pulse signals allow the microcomputer 30 to detect them even when the motor 10 runs at extremely low speed.

The present invention is not limited to the above-described exemplary embodiments only, and it is understood by those skilled in the art that various further modifications such as changes in design may be added to the exemplary embodiments based on their knowledge and the exemplary embodiments added with such modifications are also within the scope of the present invention.

The above-described exemplary embodiment presents a linear magnetic wire 70 as a concrete example of a magnetic element. However, the magnetic wire 70 may be of a bent or crooked shape, such as L or U shape. Or the magnetic element may be formed not of wire but of a pillar-shaped or film-shaped material having a predetermined cross section. In any case, it is preferable that one end of the magnetic element is disposed close to the magnet 22 and the other end thereof close to the rotating shaft 20 so as to form a stable magnetic path.

The above-described exemplary embodiment presents as an example a tetrapolar magnet 22 having two each of north poles and south poles disposed. However, a bipolar, hexapolar or other multipolar magnet may be employed which has one, three or more each of north poles and south poles alternately disposed circumferentially.

The above-described exemplary embodiment presents an example in which, as shown in FIG. 8, the rotation period and further the rotational speed are calculated based on all the pulse signals outputted from each of the magnetic detectors whenever the magnetic pole opposite each of the magnetic detectors changes. In a modification thereof, the arithmetic processing may be performed using only some of the pulse signals. For example, the rotational speed and the like may be calculated based on pulse signals SA1 and SB1 only outputted from each of the magnetic detectors whenever the magnetic pole opposite each of the magnetic detectors changes from the south pole to the north pole. Also, the rotational speed and the like may be calculated based on pulse signals SA2 and SB2 only outputted from each of the magnetic detectors whenever the magnetic pole opposite each of the magnetic detectors changes from the north pole to the south pole. The arrangement may also be such that when, for instance, one of the magnetic poles has a greater effect of magnetization on the magnetic element than the other, the pulse signals only on the side of greater effect of magnetization are used.

In the above-described exemplary embodiment, the rotation detecting method of the present invention was applied to the rotation detection of a motor for a power window control apparatus. However, it may also be applied to control equipment, for vehicular sliding roofs, automatic doors or shutters and the like, which is driven by a motor and control drive by detecting the rotational speed of the motor by a rotation detection sensor. Or it may also be applied to the rotation detection of rotating machines of generators and the like as well as the rotating bodies of flow sensors and the like.

What is claimed is:

1. A pulse signal generating apparatus for generating pulse signals in response to a rotation of a rotating body, the apparatus comprising:
   a magnet fixed to a rotating shaft of the rotating body; and
   a magnetic detector which outputs the pulse signal when the magnet passes nearby with the rotation of the rotating body, the magnetic detector including:
      a magnetic element formed of a magnetic material capable of causing a large Barkhausen jump; and
      a detection coil wound around the magnetic element,
   wherein the magnetic element of the magnetic detector, a single magnetic pole of the magnet, which is placed opposite to the magnetic element, and the rotating shaft are positioned in such relation to each other as to form a magnetic path;
   wherein the magnetic element is out of alignment with the magnet in a longitudinal direction of the rotating shaft; and
   wherein the magnet is singular.

2. A control apparatus for acquiring rotational characteristics of a motor and controlling an object to be controlled based on the rotational characteristics thereof, the control apparatus comprising:
   a magnet fixed to a rotating shaft of the motor; and
   a magnetic detector which outputs a pulse signal when the magnet passes nearby with a rotation of the motor, the magnetic detector including:
      a magnetic element formed of a magnetic material capable of causing a large Barkhausen jump; and
      a detection coil wound around the magnetic element;
   a circuit which processes the pulse signal outputted from the magnetic detector and outputs the processed signal;
   an arithmetic unit which calculates the rotational characteristics thereof based on an output signal from the circuit; and
   a control unit which controls the drive of the motor based on the calculated rotational characteristics;
   wherein the magnetic element of the magnetic detector, a single magnetic pole of the magnet, which is placed opposite to the magnetic element, and the rotating shaft are positioned in such relation to each other as to form a magnetic path;
   wherein the magnetic element is of alignment with the magnet in a longitudinal direction of the rotating shaft;
   wherein the magnet is singular; and
   wherein said single magnetic pole of the magnet and the other magnetic pole are adjacent in a circumferential direction of the rotating shaft.

3. A power window control apparatus for opening and closing a door glass of a vehicle by driving a regulator by a motor, the apparatus comprising:
   a magnet fixed to a rotating shaft of the motor; and
   a magnetic detector which outputs a pulse signal when the magnet passes nearby with a rotation of the motor, the magnetic detector including:
      a magnetic element formed of a magnetic material capable of causing a large Barkhausen jump; and
      a detection coil wound around the magnetic element;
   a circuit which processes the pulse signal outputted from the magnetic detector and outputs the processed signal;
   an arithmetic unit which calculates the rotational speed of the motor based on an output signal from the circuit; and
   a control unit which controls the rotation of the motor by shifting to a preset control mode according to the rotational speed of the motor;
   wherein the magnetic element of the magnetic detector, a single magnetic pole of the magnet, which is placed opposite to the magnetic element, and the rotating shaft are positioned in such relation to each other as to form a magnetic path;
   wherein the magnetic element is out of alignment with the magnet in a longitudinal direction of the rotating shaft:
   wherein the magnet is singular; and
   wherein the magnet is such that said single magnetic pole and the other magnetic pole adjacent in a circumferential direction of the rotating shaft.

4. The pulse signal generating apparatus according to claim 1, wherein said one magnetic pole of the magnet and the other magnetic pole are adjacent in a circumferential direction of the rotating shaft.

5. The pulse signal generating apparatus according to claim 4, wherein, while said one of magnetic pole of the magnet forms a magnetic path, the other magnetic pole does not form a magnetic path.

6. The pulse signal generating apparatus according to claim 5, wherein the magnet is disk-shaped.

7. A pulse signal generating apparatus according to claim 3, wherein the magnetic element is disposed such that one end thereof is closer to the magnet than the other end thereof.

8. A pulse signal generating apparatus according to claim 7, wherein the magnetic element is disposed such that the other end thereof is closer to the rotating shaft than the one end thereof.

9. The pulse signal generating apparatus according to claim 8, wherein the magnetic detector comprises a first magnetic detector and a second magnetic detector arranged at a predetermined distance in a circumferential direction of the rotating shaft; and
   the magnetic element of the first magnetic detector and the magnetic element of the second magnetic detector are arranged such that a distance between the ends thereof toward the magnet is larger than a distance between the other ends thereof toward the rotation shaft.

* * * * *